United States Patent
Park et al.

(10) Patent No.: US 12,142,320 B2
(45) Date of Patent: Nov. 12, 2024

(54) MEMORY DEVICE AND METHOD OF OPERATING THE SAME

(71) Applicant: SK hynix Inc., Icheon-si (KR)

(72) Inventors: Jong Kyung Park, Icheon-si (KR); Jae Yeop Jung, Icheon-si (KR); Dong Hun Kwak, Icheon-si (KR)

(73) Assignee: SK hynix Inc., Ichaon-si (KR)

( * ) Notice: Subject to any disclaimer, the term of this patent is extended or adjusted under 35 U.S.C. 154(b) by 119 days.

(21) Appl. No.: 17/972,224

(22) Filed: Oct. 24, 2022

(65) Prior Publication Data

US 2023/0402096 A1 Dec. 14, 2023

(30) Foreign Application Priority Data

Jun. 8, 2022 (KR) .................. 10-2022-0069740

(51) Int. Cl.
  *G11C 16/04* (2006.01)
  *G11C 16/26* (2006.01)
  *G11C 16/32* (2006.01)

(52) U.S. Cl.
  CPC .......... *G11C 16/0433* (2013.01); *G11C 16/26* (2013.01); *G11C 16/32* (2013.01)

(58) Field of Classification Search
  CPC ...... G11C 16/0433; G11C 16/26; G11C 16/32
  See application file for complete search history.

(56) References Cited

U.S. PATENT DOCUMENTS

| | | | |
|---|---|---|---|
| 9,361,993 B1 * | 6/2016 | Chen .................. | G11C 16/3422 |
| 2018/0218775 A1 * | 8/2018 | Kim ..................... | G11C 16/16 |
| 2019/0019556 A1 * | 1/2019 | Sakui ................... | G11C 5/144 |
| 2021/0035622 A1 * | 2/2021 | Kim ..................... | G11C 16/32 |
| 2022/0130467 A1 * | 4/2022 | Yu ....................... | G11C 16/26 |
| 2023/0386562 A1 * | 11/2023 | Lee ..................... | G11C 11/4093 |

FOREIGN PATENT DOCUMENTS

| | | |
|---|---|---|
| KR | 1020180054023 A | 5/2018 |
| KR | 1020210011793 A | 2/2021 |
| KR | 1020210083480 A | 7/2021 |

* cited by examiner

*Primary Examiner* — Min Huang
(74) *Attorney, Agent, or Firm* — WILLIAM PARK & ASSOCIATES LTD.

(57) ABSTRACT

Provided herein may be a memory device and a method of operating the same. The memory device may include a plurality of memory cell strings, a peripheral circuit configured to, using a plurality of read voltages, perform a read operation that reads data that is stored in a selected memory cell that is included in a selected memory cell string, and an operation controller configured to control the peripheral circuit to perform the read operation by using a first read voltage, a first potential adjustment operation, and the read operation by using a second read voltage that is lower than the first read voltage, wherein the first potential adjustment operation is an operation that applies a first turn-on voltage to unselected source select lines that are coupled to unselected memory cell strings for a first period and thereafter applies a ground voltage to the unselected source select lines.

18 Claims, 14 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2022-0069740, filed on Jun. 8, 2022, in the Korean Intellectual Property Office, the entire disclosure of which is incorporated herein by reference.

BACKGROUND

1. Technical Field

Various embodiments of the present disclosure relate to an electronic device, and more particularly to a memory device and a method of operating the memory device.

2. Related Art

Because a three-dimensional (3D) memory device is designed in a multi-memory cell string structure to improve the degree of integration of memory cells, a problem arises in that the 3D memory device is vulnerable to a read disturbance phenomenon in which the threshold voltages of memory cells are varied during a read operation. As a solution to overcome this, an operation of initializing a channel potential between a plurality of read operations is performed. As another solution, there is a scheme for performing a read operation after raising a channel potential by turning off transistors that are coupled to unselected drain select lines and unselected source select lines that are coupled to unselected memory cell strings before data that is stored in memory cells is read. However, when the channel potential rises, a soft erase phenomenon may occur in which charges that are stored in the memory cells that are included in the unselected memory cell strings are lost during a read operation. Therefore, there is a need to lower the channel potential during a read operation to improve such a soft erase phenomenon.

SUMMARY

An embodiment of the present disclosure may provide for a memory device. The memory device may include a plurality of memory cell strings, each including a plurality of memory cells coupled between a drain select line and a source select line, a peripheral circuit configured to, using a plurality of read voltages, perform a read operation that reads data that is stored in a selected memory cell that is included in a selected memory cell string, among the plurality of memory cell strings, and an operation controller configured to control the peripheral circuit to perform the read operation by using a first read voltage, among the plurality of read voltages, a first potential adjustment operation is performed after performing the read operation, and the read operation is performed after performing the first potential adjustment operation, by using a second read voltage that is lower than the first read voltage, wherein the first potential adjustment operation is an operation that applies a first turn-on voltage to unselected source select lines that are coupled to unselected memory cell strings, among the plurality of memory cell strings, for a first period and thereafter applies a ground voltage to the unselected source select lines.

An embodiment of the present disclosure may provide for a method of operating a memory device, the memory device performing a read operation that reads data that is stored in a selected memory cell that is included in a selected memory cell string, among a plurality of memory cell strings, using a plurality of read voltages. The method may include performing the read operation by using a first read voltage, among the plurality of read voltages, applying a first turn-on voltage to unselected source select lines that are coupled to unselected memory cell strings, among the plurality of memory cell strings, for a first period and thereafter applying a ground voltage to the unselected source select lines, and performing the read operation by using a second read voltage that is lower than the first read voltage.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms and should not be construed as being limited to the embodiments described in the specification or application.

Various embodiments of the present disclosure are directed to a memory device that is capable of improving a phenomenon in which the threshold voltages of memory cells are varied during a read operation, and a method of operating the memory device.

Figure 1:
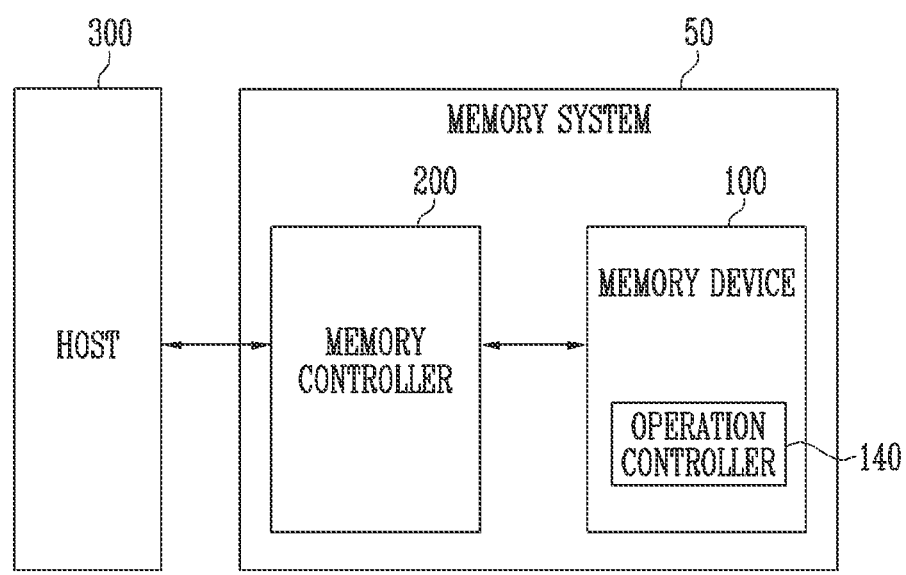
FIG. 1 is a diagram illustrating a memory system including a memory device according to an embodiment of the present disclosure.

FIG. 1 is a diagram illustrating a memory system including a memory device according to an embodiment of the present disclosure.

Referring to FIG. 1, a memory system 50 may include a memory device 100 and a memory controller 200. The memory system 50 may be a device which stores data under the control of a host 300, such as a mobile phone, a smartphone, an MP3 player, a laptop computer, a desktop computer, a game console, a TV, a tablet PC, or an in-vehicle infotainment system.

The memory system 50 may be manufactured as any one of various types of storage devices depending on a host interface that is a scheme for communication with the host 300. For example, the memory system 50 may be implemented as any one of various types of storage devices, for example, a solid state drive (SSD), a multimedia card such as an MMC, an embedded MMC (eMMC), a reduced size MMC (RS-MMC), or a micro-MMC, a secure digital card such as an SD, a mini-SD, or a micro-SD, a universal serial bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The memory system 50 may be manufactured in any one of various types of package forms. For example, the memory system 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 may be operated under the control of the memory controller 200. The memory device 100 may include a memory cell array (not illustrated) including a plurality of memory cells that store data.

Each of the memory cells may be implemented as a single-level cell (SLC) capable of storing one bit of data, a multi-level cell (MLC) capable of storing two bits of data, a triple-level cell (TLC) capable of storing three bits of data, or a quad-level cell (QLC) capable of storing four bits of data.

The memory cell array (not illustrated) may include a plurality of memory blocks. Each memory block may include a plurality of memory cells. One memory block may include a plurality of pages. In an embodiment, a page may be the unit by which data is stored in the memory device 100 or the unit by which data that is stored in the memory device 100 is read. A memory block may be the unit by which data is erased.

In an embodiment, the memory device 100 may be implemented as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory, a resistive RAM (RRAM), a phase-change RAM (PRAM), a magne-toresistive RAM (MRAM), a ferroelectric RAM (FRAM), or a spin transfer torque RAM (STT-RAM). For convenience of description, in the present specification, a description is made on the assumption that the memory device 100 is a NAND flash memory.

The memory device 100 may receive a command and an address from the memory controller 200 and may access the area of the memory cell array, selected by the address. The memory device 100 may perform an operation indicated by the command on the area that is selected by the address. For example, the memory device 100 may perform a write operation (i.e., a program operation), a read operation, and an erase operation. During a write operation, the memory device 100 may program data to the area that is selected by the address. During a read operation, the memory device 100 may read data from the area that is selected by the address. During an erase operation, the memory device 100 may erase data that is stored in the area that is selected by the address.

In an embodiment, the memory device 100 may include an operation controller 140.

The operation controller 140 may control a program operation and a read operation that are performed on memory cells. The program operation may be an operation that stores data in the memory cells. The read operation may be an operation that obtains data that is stored in the memory cells.

In an embodiment, the read operation may be an operation that applies a read voltage to a word line coupled to the memory cells and sensing data that is stored in the memory cells. Because the threshold voltages of the memory cells are determined depending on the stored data, the read operation may be an operation that identifies program states, among a plurality of program states, corresponding to the threshold voltages of the memory cells. For example, when the memory cells are programmed according to a TLC scheme, seven read voltages may be applied to identify which of an erased state and first to seventh program states corresponds to each of the threshold voltages of the memory cells.

In an embodiment, the operation controller 140 may control a potential adjustment operation that changes the potential of channels that are coupled to memory cells after a read operation is performed. For example, the operation controller 140 may lower the channel potential by applying a turn-on voltage to a drain select line and a source select line that are coupled to the memory cells in the potential adjustment operation. In an example, the operation controller 140 may raise the channel potential by applying a ground voltage to the drain select line and the source select line in the potential adjustment operation.

The memory controller 200 may control the overall operation of the memory system 50.

When power is applied to the memory system 50, the memory controller 200 may run firmware (FW). When the memory device 100 is a flash memory device, the firmware (FW) may include a host interface layer (HIL) that controls communication with the host 300, a flash translation layer (FTL) that controls communication between the host 300 and the memory device 100, and a flash interface layer (FIL) that controls communication with the memory device 100.

In an embodiment, the memory controller 200 may receive data and a logical block address (LBA) from the host 300 and may translate the logical block address (LBA) into a physical block address (PBA) that indicates the address of memory cells that are included in the memory device 100 and in which data is to be stored. In the present specification, the terms "logical block address (LBA)" and "logical address" may be used interchangeably. In the present specification, the physical block address (PBA) and "physical address" may be used interchangeably.

The memory controller 200 may control the memory device 100 so that a write operation, a read operation, or an erase operation is performed in response to a request that is received from the host 300. During a write operation, the memory controller 200 may provide a write command, a physical block address, and data to the memory device 100. During a read operation, the memory controller 200 may provide a read command and a physical block address to the memory device 100. During an erase operation, the memory controller 200 may provide an erase command and a physical block address to the memory device 100.

In an embodiment, the memory controller 200 may internally generate a command, an address, and data regardless of whether a request from the host 300 is received and may transmit them to the memory device 100. For example, the memory controller 200 may provide the memory device 100 with commands, addresses, and data that are required to perform read operations and write operations that are involved in performing wear leveling, read reclaim, garbage collection, etc.

In an embodiment, the memory controller 200 may control two or more memory devices 100. In this case, the memory controller 200 may control the memory devices 100 depending on an interleaving scheme to improve operating performance. The interleaving scheme may be a scheme for controlling the memory devices 100 so that the operations of at least two memory devices 100 overlap each other.

The host 300 may communicate with the memory system 50 by using at least one of various communication methods, such as universal serial bus (USB), Serial AT Attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 2:
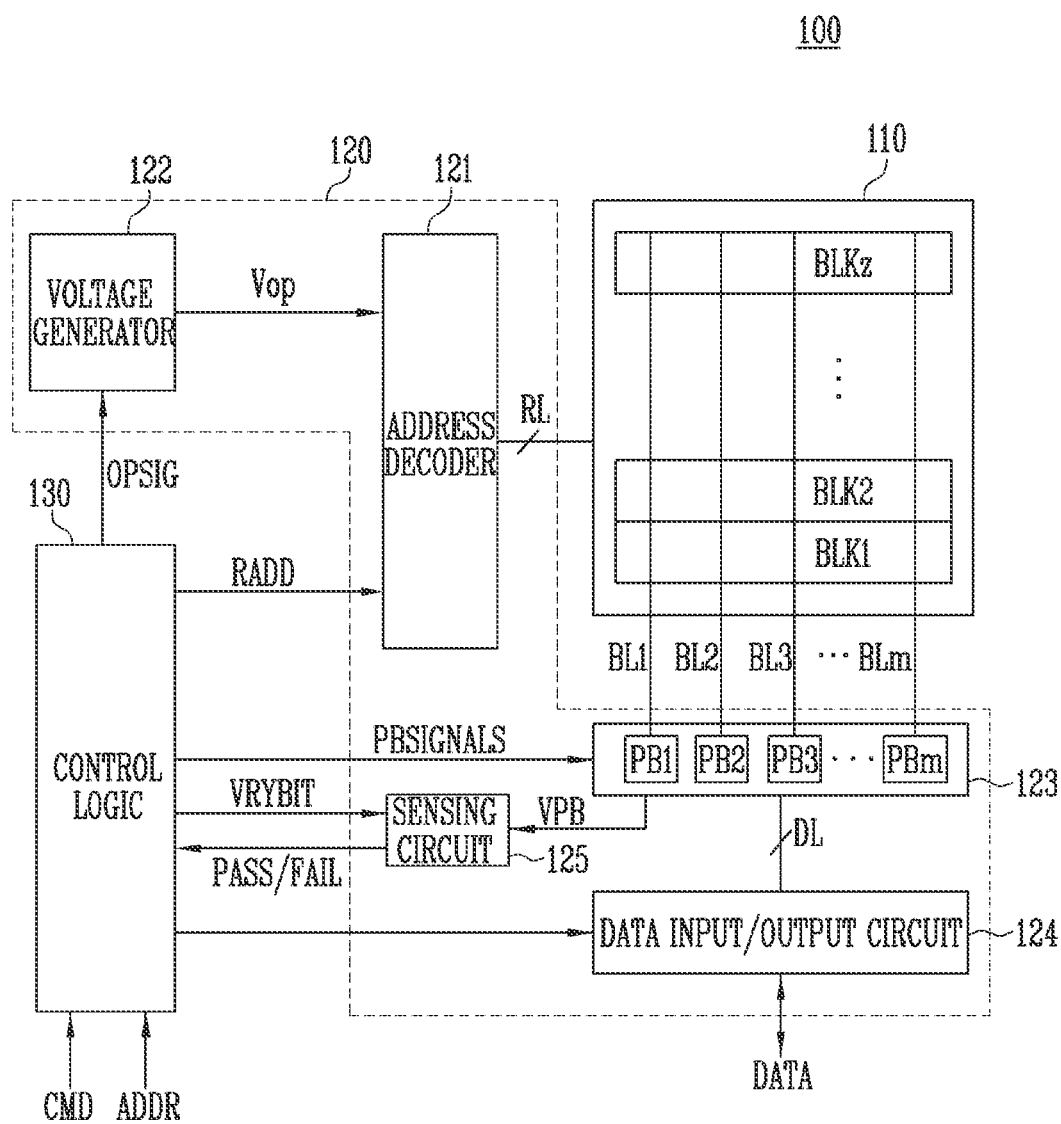
FIG. 2 is a diagram illustrating the structure of the memory device of FIG. 1.

FIG. 2 is a diagram illustrating the structure of the memory device of FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz may be coupled to an address decoder 121 through row lines RL. The memory blocks BLK1 to BLKz may be coupled to a page buffer group 123 through bit lines BL1 to BLm. Each of the memory blocks BLK1 to BLKz may include a plurality of memory cells. In an embodiment, the plurality of memory cells may be nonvolatile memory cells. Memory cells, among the plurality of memory cells, coupled to the same word line, are defined as one page. In other words, the memory cell array 110 may be formed of a plurality of pages. In an embodiment of the present disclosure, each of the memory blocks BLK1 to BLKz that is included in the memory cell array 110 may include a plurality of dummy cells. For the dummy cells, one or more dummy cells may be coupled in series between a drain select transistor and memory cells and between a source select transistor and the memory cells.

Each of the memory cells of the memory device 100 may be implemented as a single-level cell (SLC) capable of storing one bit of data, a multi-level cell (MLC) capable of storing two bits of data, a triple-level cell (TLC) capable of storing three bits of data, or a quad-level cell (QLC) capable of storing four bits of data.

The peripheral circuit 120 may drive the memory cell array 110. In an example, the peripheral circuit 120 may drive the memory cell array 110 so that a program operation, a read operation, and an erase operation are performed under the control of the control logic 130. In an example, the peripheral circuit 120 may apply various driving voltages Vop to the row lines RL and the bit lines BL1 to BLm or discharge the applied voltages under the control of the control logic 130.

The peripheral circuit 120 may include the address decoder 121, a voltage generator 122, the page buffer group 123, a data input/output circuit 124, and a sensing circuit 125.

The address decoder 121 may be coupled to the memory cell array 110 through the row lines RL. The row lines RL may include drain select lines, word lines, source selection lines, and a common source line. In accordance with an embodiment of the present disclosure, the word lines may include normal word lines and dummy word lines. In accordance with an embodiment of the present disclosure, the row lines RL may further include a pipe select line.

The address decoder 121 may be operated under the control of the control logic 130. The address decoder 121 may receive addresses ADDR from the control logic 130.

The address decoder 121 may decode a block address, among the received addresses ADDR. The address decoder 121 may select at least one of the memory blocks BLK1 to BLKz according to the decoded block address. The address decoder 121 may decode a row address RADD, among the received addresses ADDR. The address decoder 121 may select at least one word line of the selected memory block by applying voltages that are supplied from the voltage generator 122 to the at least one word line according to the decoded row address RADD.

During a program operation, the address decoder 121 may apply a program voltage to the selected word line and may apply a pass voltage having a level that is lower than that of the program voltage to unselected word lines. During a program verify operation, the address decoder 121 may apply a verify voltage to the selected word line and may apply a verify pass voltage having a level that is higher than that of the verify voltage to unselected word lines.

During a read operation, the address decoder 121 may apply a read voltage to the selected word line and apply a read pass voltage having a level that is higher than that of the read voltage to unselected word lines.

The erase operation of the memory device 100 may be performed on a memory block basis. During the erase operation, the addresses ADDR that are input to the memory device 100 may include a block address. The address decoder 121 may decode the block address and may select one memory block according to the decoded block address. During the erase operation, the address decoder 121 may apply a ground voltage to word lines that are coupled to the selected memory block.

The address decoder 121 may decode a column address, among the received addresses ADDR. The decoded column address may be transferred to the page buffer group 123. In an embodiment, the address decoder 121 may include components such as a row decoder, a column decoder, and an address buffer.

The voltage generator 122 may generate the plurality of driving voltages Vop by using an external supply voltage that is supplied to the memory device 100. The voltage generator 122 may be operated under the control of the control logic 130.

In an embodiment, the voltage generator 122 may generate an internal supply voltage by regulating the external supply voltage. The internal supply voltage that is generated by the voltage generator 122 may be used as a driving voltage for the memory device 100.

In an embodiment, the voltage generator 122 may generate various driving voltages Vop that are used for program, read, and erase operations in response to an operation signal OPSIG. The voltage generator 122 may generate the plurality of driving voltages Vop by using the external supply voltage or the internal supply voltage. The voltage generator 122 may generate various voltages that are required by the memory device 100. For example, the voltage generator 122 may generate a plurality of erase voltages, a plurality of program voltages, a plurality of program pass voltages, a plurality of read voltages, and a plurality of read pass voltages.

The voltage generator 122 may include a plurality of pumping capacitors for receiving the internal supply voltage to generate a plurality of driving voltages Vop having various voltage levels and may generate the plurality of driving voltages Vop by selectively enabling the plurality of pumping capacitors under the control of the control logic 130.

The generated driving voltages Vop may be supplied to the memory cell array 110 by the address decoder 121.

The page buffer group 123 may include first to m-th page buffers PB1 to PBm. The first to m-th page buffers PB1 to PBm may be coupled to the memory cell array 110 through the first to m-th bit lines BL1 to BLm, respectively. The first to m-th page buffers PB1 to PBm may be operated under the control of the control logic 130.

The first to m-th page buffers PB1 to PBm may transmit/receive data DATA to/from the data input/output circuit 124. During a program operation, the first to m-th page buffers PB1 to PBm may receive data DATA to be stored through the data input/output circuit 124 and data lines DL.

During a program operation, the first to m-th page buffers PB1 to PBm may transfer the data DATA to be stored, received through the data input/output circuit 124, to selected memory cells through the bit lines BL1 to BLm when a program pulse is applied to a selected word line. The memory cells in a selected page may be programmed based on the received data DATA. Memory cells that are coupled to a bit line to which a program enable voltage (e.g., a ground voltage) is applied may have increased threshold voltages. The threshold voltages of memory cells that are coupled to a bit line to which a program-inhibit voltage (e.g., a supply voltage) is applied may be maintained. During a program verify operation, the first to m-th page buffers PB1 to PBm may read the data DATA that is stored in the selected memory cells from the selected memory cells through the bit lines BL1 to BLm.

During a read operation, the page buffer group 123 may read data DATA from the memory cells in the selected page through the bit lines BL1 to BLm and may store the read data DATA in the first to m-th page buffers PB1 to PBm.

During an erase operation, the page buffer group 123 may allow the bit lines BL1 to BLm to float. In an embodiment, the page buffer group 123 may include a column select circuit.

In an embodiment, while pieces of data that is stored in some of the plurality of page buffers that are included in the page buffer group 123 are being programmed to the memory cell array 110, the remaining page buffers may receive new data from the memory controller 200 and then may store the new data.

The data input/output circuit 124 may be coupled to the first to m-th page buffers PB1 to PBm through the data lines DL. The data input/output circuit 124 may be operated under the control of the control logic 130.

The data input/output circuit 124 may include a plurality of input/output buffers (not illustrated) that receive input data DATA. During a program operation, the data input/output circuit 124 receives the data DATA to be stored from an external controller (not illustrated). During a read operation, the data input/output circuit 124 outputs the data DATA, received from the first to m-th page buffers PB1 to PBm that are included in the page buffer group 123, to the external controller.

During a read operation or a verify operation, the sensing circuit 125 may generate a reference current in response to an enable bit signal VRYBIT that is generated by the control logic 130 and may output a pass signal or a fail signal to the control logic 130 by comparing a sensing voltage VPB that is received from the page buffer group 123 with a reference voltage that is generated by the reference current. In an example, the sensing circuit 125 may output a pass signal to the control logic 130 when the magnitude of the sensing voltage VPB is lower than that of the reference voltage. In an example, the sensing circuit 125 may output a fail signal to the control logic 130 when the magnitude of the sensing voltage VPB is lower than that of the reference voltage.

The control logic 130 may be coupled to the address decoder 121, the voltage generator 122, the page buffer group 123, the data input/output circuit 124, and the sensing circuit 125. The control logic 130 may control the overall operation of the memory device 100. The control logic 130 may be operated in response to a command CMD that is transferred from an external device.

The control logic 130 may control the peripheral circuit 120 by generating various types of signals in response to the command CMD and the addresses ADDR. For example, the control logic 130 may generate an operation signal OPSIG, the row address RADD, page buffer control signals PBSIGNALS, and the enable bit VRYBIT in response to the command CMD and the addresses ADDR. The control logic 130 may output the operation signal OPSIG to the voltage generator 122, may output the row address RADD to the address decoder 121, output the page buffer control signals PBSIGNALS to the page buffer group 123, and output the enable bit VRYBIT to the sensing circuit 125. In addition, the control logic 130 may determine whether a verify operation has passed or failed in response to the pass or fail signal PASS or FAIL that is output from the sensing circuit 125.

The operation controller 140, illustrated in FIG. 1, may be included in the control logic 130, illustrated in FIG. 2.

The operation controller 140 may control the peripheral circuit 120 so that driving voltages Vop to be used in a read operation are applied to the row lines RL and the bit lines BL1 to BLm. In an example, the operation controller 140 may control the peripheral circuit 120 so that, during the read operation, the read voltage and the read pass voltage are applied to the plurality of word lines. Also, the operation controller 140 may control the peripheral circuit 120 so that, during the potential adjustment operation, the turn-on voltage and the ground voltage are applied to drain select lines and source select lines that are coupled to memory cells. In detail, the operation controller 140 may control the voltage generator 122 so that the driving voltages Vop to be used in the read operation and the potential adjustment operation are generated. Thereafter, the voltage generator 122 may provide the generated driving voltages Vop to the address decoder 121. The address decoder 121 may transfer the driving voltages Vop to the plurality of word lines, the drain select lines, and the source select lines. During the read operation and the potential adjustment operation, the voltage magnitudes of the plurality of word lines, the drain select lines, and the source select lines may be changed depending on the magnitudes of the driving voltages Vop that are provided by the address decoder 121.

Figure 3:
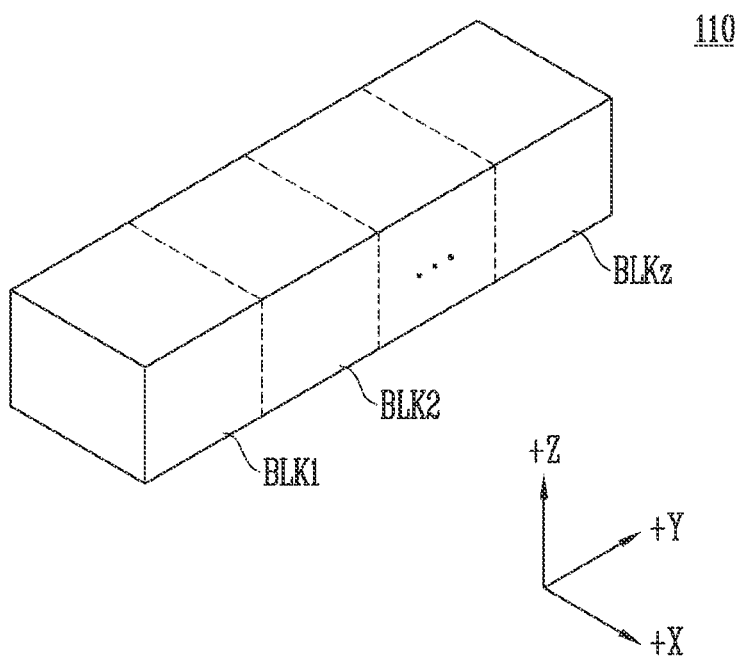
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 may include a plurality of memory blocks BLK1 to BLKz. Each of the memory blocks may have a three-dimensional (3D) structure. Each of the memory blocks may include a plurality of memory cells that are stacked on a substrate. The plurality of memory cells are arranged in +X, +Y, and +Z directions. The structure of each memory block will be described in greater detail below with reference to FIGS. 4 and 5.

Figure 4:
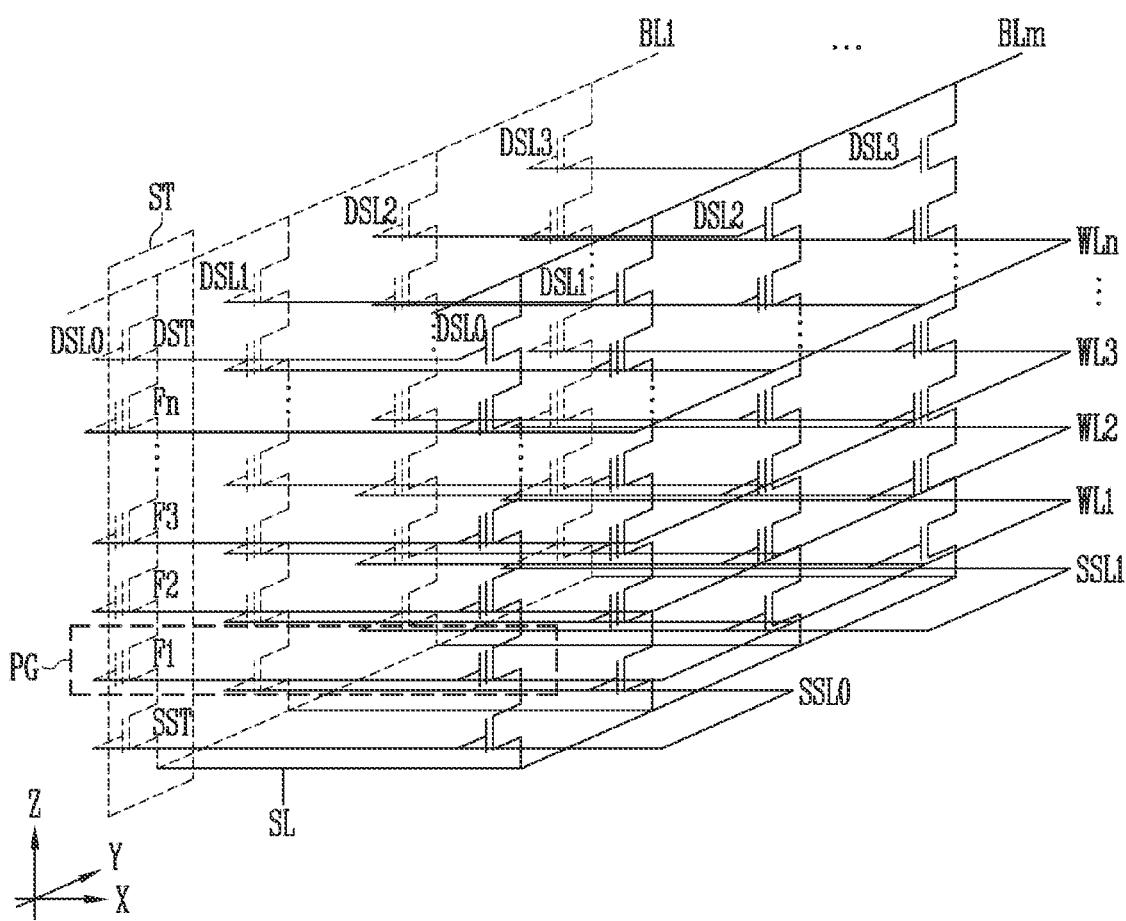
FIG. 4 is a circuit diagram illustrating any one memory block of a plurality of memory blocks BLK1 to BLKz of FIG. 3.

FIG. 4 is a circuit diagram illustrating any one memory block of a plurality of memory blocks BLK1 to BLKz of FIG. 3.

Figure 5:
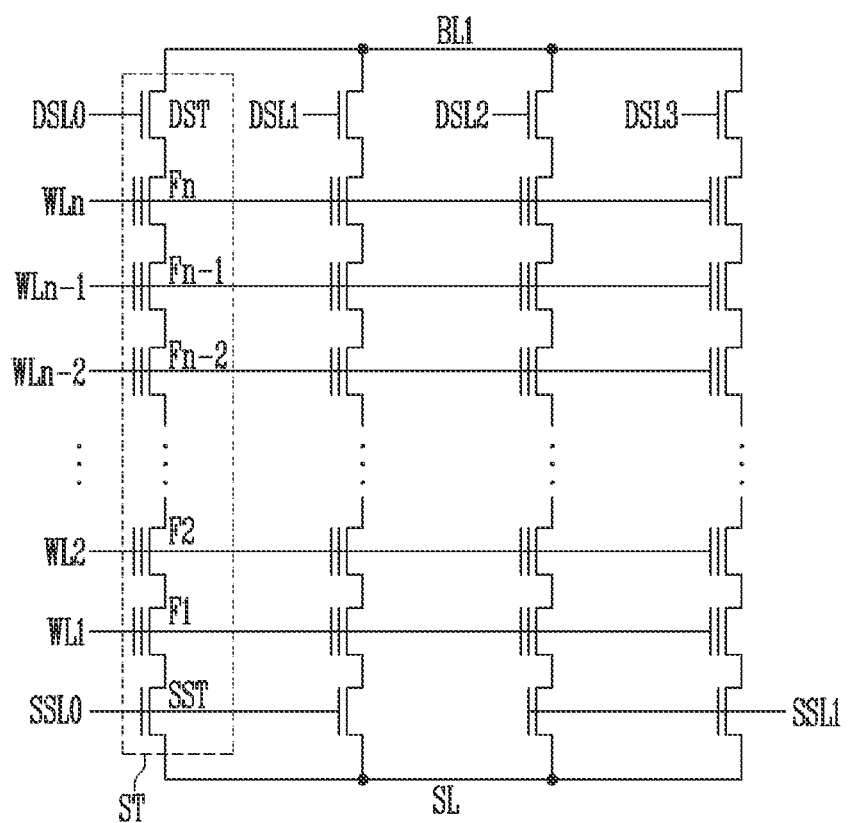
FIG. 5 is a circuit diagram illustrating memory cell strings illustrated in FIG. 4.

FIG. 5 is a circuit diagram illustrating memory cell strings illustrated in FIG. 4.

Referring to FIGS. 4 and 5, respective memory cell strings ST may be coupled between bit lines BL1 to BLm and a source line SL. A memory cell string ST that is coupled between the first bit line BL1 and the source line SL is described by way of example.

The memory cell string ST may include a source select transistor SST, memory cells F1 to Fn (where n is a positive integer), and a drain select transistor DST that are coupled in series between the source line SL and the first bit line BL1. Gates of source select transistors SST that are included in different memory cell strings ST that are coupled to different bit lines BL1 to BLm may be coupled to a first source select line SSL0 and to a second source select line SSL1. For example, among the source select transistors SST, source select transistors that are adjacent to each other in a second direction Y may be coupled to the same source select line. For example, assuming that the source select transistors SST are sequentially arranged along the second direction Y, the gates of the source select transistors SST that are arranged from the first source select transistor SST in a first direction X and are included in different memory cell strings ST, and the gates of source select transistors SST that are arranged from the second source select transistor SST in the first direction X and are included in different memory cell strings ST may be coupled to the first source select line SSL0. Also, the gates of the source select transistors SST that are arranged from the third source select transistor SST in the first direction X and are included in different memory cell strings ST, and the gates of source select transistors SST that are arranged from the fourth source select transistor SST in the first direction X and are included in different memory cell strings ST may be coupled to the second source select line SSL1.

The gates of the memory cells F1 to Fn may be coupled to the word lines WL1 to WLn, and the gates of the drain select transistors DST may be coupled to any one of the first to fourth drain select lines DSL0 to DSL3.

The gates of the transistors that are arranged in the first direction X, among the drain select transistors DST, may be coupled in common to the same drain select line (e.g., DSL0), but the gates of the transistors that are arranged in the second direction Y may be coupled to different drain select lines DSL1 to DSL3. For example, assuming that drain select transistors DST are sequentially arranged along the second direction Y, the gates of the drain select transistors DST that are arranged from the first drain select transistor DST in the first direction X and are included in different memory cell strings ST may be coupled to the first drain select line DSL0. The drain select transistors DST, arranged from the drain select transistors DST that are coupled to the first drain select line DSL0 in the second direction Y, may be sequentially coupled to the second to fourth drain select lines DSL1 to DSL3. Therefore, in the selected memory block, memory cell strings ST that are coupled to the selected drain select line may be selected, and memory cell strings ST that are coupled to the remaining drain select lines, that is, unselected drain select lines, may be unselected. For example, when the first drain select line DSL0 is selected, a memory cell string that are coupled to the first drain select line DSL0 is the selected memory cell string, and the memory cell strings that are coupled to second to fourth drain select lines DSL1 to DSL3 may be unselected memory cell strings. Further, the first drain select line DSL0 may be a selected drain select line, and the second to fourth drain select lines DSL1 to DSL3 may be unselected drain select lines. Furthermore, when the first drain select line DSL0 is selected, the first source select line SSL0 may be the selected source select line, and the second source select line SSL1 may be an unselected source select line.

The memory cells that are coupled to the same word line may form one page PG. Here, the term "page" means a physical page. For example, among the memory cell strings ST that are coupled to the first bit line BL1 to the m-th bit line BLm, a group of memory cells that are coupled in the first direction X in the same word line may be referred to as a page PG. For example, among the first memory cells F1 that are coupled to the first word line WL1, memory cells that are arranged in the first direction X may form one page PG. Among the first memory cells F1 that are coupled in common to the first word line WL1, memory cells that are arranged in the second direction Y may be divided into different pages. Therefore, when the first drain select line DSL0 is a selected drain select line and the first word line WL1 is a selected word line, a page, among a plurality of pages PG that are coupled to the first word line WL1, coupled to the first drain select line DSL0, may be the selected page. The pages that are coupled in common to the word line WL1 but are coupled to unselected second to fourth drain select lines DSL1 to DSL3 may be unselected pages.

In an embodiment, when the memory cells are programmed according to a TLC scheme in which three bits of data are stored in each memory cell, data that is stored in one page may be multi-page data. For example, the multi-page data may include a plurality of logical pages. In detail, the plurality of logical pages may include a least significant bit (LSB) page, a central significant bit (CSB) page, and a most significant bit (MSB) page.

Although, in the drawing, one source select transistor SST and one drain select transistor DST are illustrated as being included in one memory cell string ST, a plurality of source select transistors SST and a plurality of drain select transistors DST may be included in one memory cell string ST depending on the memory device. Also, dummy cells may be included between the source select transistor SST, the memory cells F1 to Fn, and the drain select transistor DST depending on the memory device. The dummy cells do not store user data like the normal memory cells F1 to Fn, but may be used to improve the electrical characteristics of each memory cell string ST.

Figure 6:
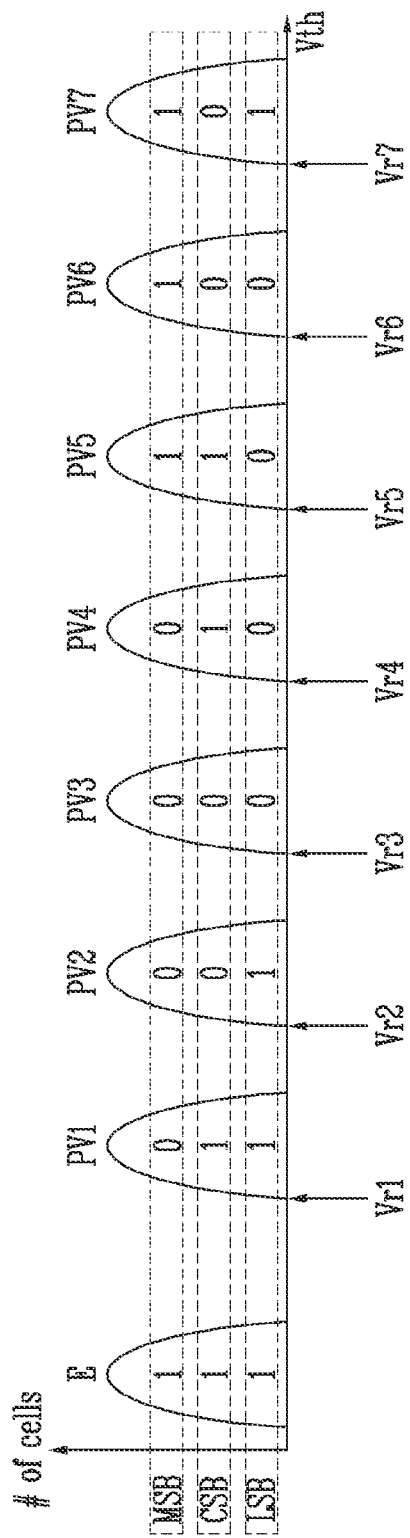
FIG. 6 is a diagram illustrating a read operation of a memory device.

FIG. 6 is a diagram illustrating a read operation of a memory device.

In FIG. 6, the horizontal axis of a graph may indicate threshold voltages Vth of memory cells, and the vertical axis thereof may indicate the number of memory cells (# of cells).

In FIG. 6, a description is made on the assumption that memory cells are programmed according to a TLC scheme in which three bits of data are stored in one memory cell. Referring to FIG. 6, the threshold voltage of each of a plurality of memory cells may be increased to a threshold voltage corresponding to any one of an erased state E and first to seventh program states PV1 to PV7 through a program operation. Thereafter, the memory device 100 may perform a read operation that obtains data that is stored in the memory cells. In detail, when a read voltage is applied to a word line that is coupled to selected memory cells, among the plurality of memory cells, the memory device 100 may sense data that is stored in the selected memory cells by detecting currents that are changed on the bit lines that are coupled to the selected memory cells. The data that is stored in the memory cells may vary depending on the program states of the memory cells. In detail, different pieces of data may be stored depending on any of the erased state E and the first to seventh program states PV1 to PV7 to which the threshold voltage of each memory cell corresponds.

In an embodiment, the memory device 100 may perform a read operation on each of the plurality of logical pages by using a plurality of read voltages. The plurality of logical pages may include an LSB page, a CSB page, and an MSB page. For example, as illustrated in FIG. 6, when the LSB page corresponding to the erased state E and the first to seventh program states PV1 to PV7 is 11100001, a read operation may be performed on the LSB page by using a third read voltage Vr3 and a seventh read voltage Vr7 for distinguishing 1 from 0. Further, when the CSB page corresponding to the erased state E and the first to seventh program states PV1 to PV7 is 11001100, a read operation may be performed on the CSB page by using a second read voltage Vr2, a fourth read voltage Vr4, and a sixth read voltage Vr6 for distinguishing 1 from 0. Furthermore, when the MSB page corresponding to the erased state E and the first to seventh program states PV1 to PV7 is 10000111, a read operation may be performed on the MSB page by using a first read voltage Vr1 and a fifth read voltage Vr5 for distinguishing 1 from 0.

In other embodiments, bits that are included in the LSB page, the CSB page, and the MSB page may be stored in a form different from that of FIG. 6. In this case, read voltages required for performing the read operation on the LSB page, the CSB page, and the MSB page may vary. For example, although the case in which the number of read voltages used in the read operation on LSB pages is 2 is illustrated in FIG. 6, the read operation may be performed by using three read voltages depending on the bits included in the LSB page. That is, the magnitudes and the number of read voltages for distinguishing 1 from 0 may vary depending on the bits included in the LSB page, the CSB page, and the MSB page.

Figure 7:
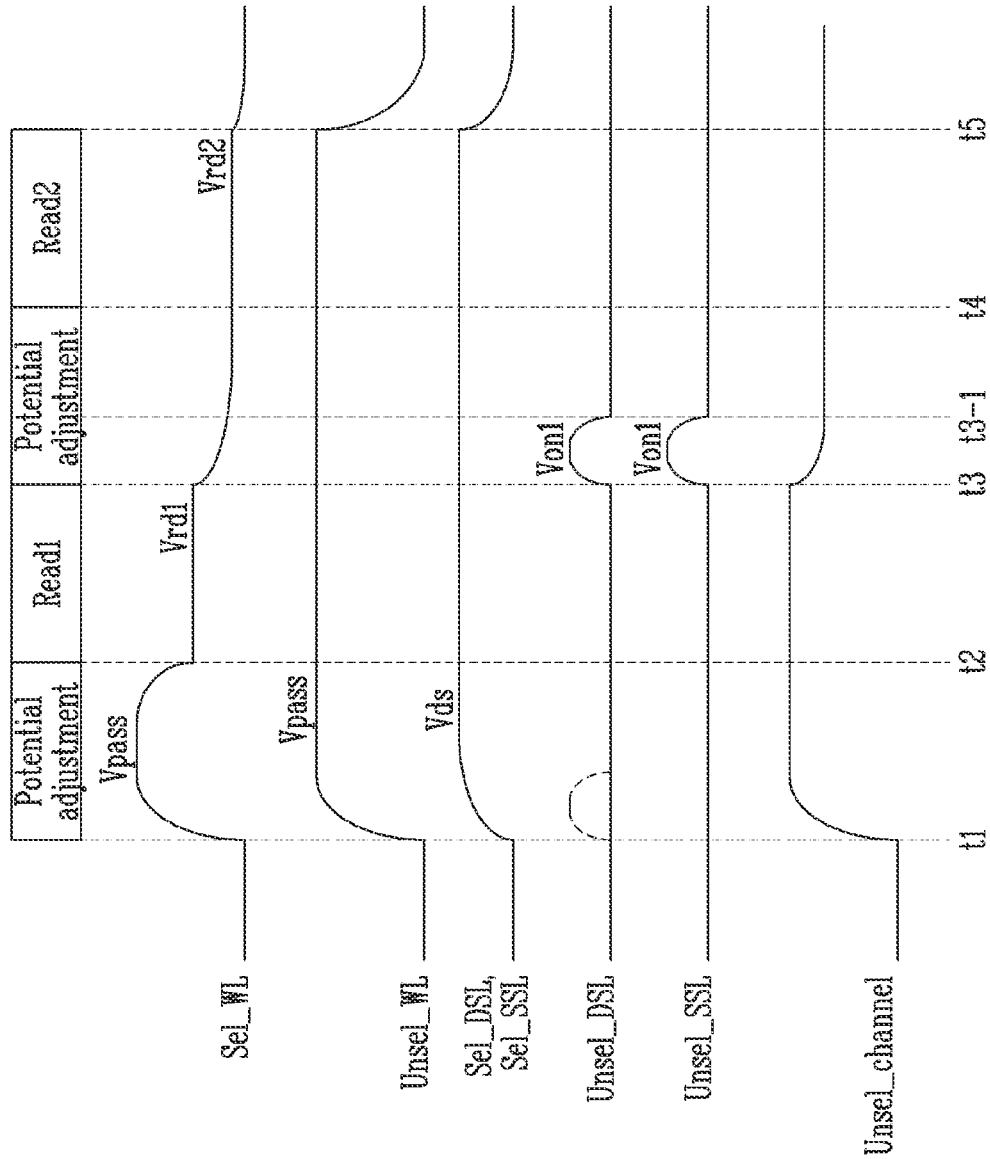
FIG. 7 is a diagram illustrating a first read operation and a second read operation according to an embodiment of the present disclosure.

FIG. 7 is a diagram illustrating a first read operation and a second read operation according to an embodiment of the present disclosure.

Referring to FIG. 7, a memory device 100 may select any one of a plurality of memory blocks included in a memory cell array in response to a read command and an address that is received from a memory controller and may select a memory cell string in which a read operation on the selected memory block is to be performed. Thereafter, the memory device 100 may perform a first read operation Read1 and a second read operation Read2. In an embodiment, the first read operation Read1 and the second read operation Read2 may be read operations performed on an LSB page by using the third read voltage Vr3 and the seventh read voltage Vr7 illustrated in FIG. 6. In an embodiment, the first read operation Read1 and the second read operation Read2 may be read operations that are performed on an MSB page by using the first read voltage Vr1 and the fifth read voltage Vr5 illustrated in FIG. 6. That is, the first read operation Read1 and the second read operation Read2 may be read operations performed on a logical page by using two read voltages.

In an embodiment, the memory device 100 may perform a potential adjustment operation before the first and second read operations Read1 and Read2. The potential adjustment operation may be an operation of changing the channel potential Unsel_channel of unselected memory cell strings.

During a period from t1 to t2, the memory device 100 may perform the potential adjustment operation. In detail, the memory device 100 may apply a pass voltage Vpass to a selected word line Sel_WL and thereafter apply a first read voltage Vrd1 to the selected word line Sel_WL. The pass voltage Vpass may be a voltage that is higher than the first read voltage Vrd1. During the period from t1 to t2, the memory device 100 may apply the pass voltage Vpass to unselected word lines Unsel_WL. During the period from t1 to t2, the memory device 100 may apply a select line voltage Vds to a selected drain select line sel_DSL and a selected source select line sel_SSL. The select line voltage Vds may be a voltage that is higher than the threshold voltages of a drain select transistor and a source select transistor, respectively coupled to the selected drain select line Sel_DSL and the selected source select line Sel_SSL. During the period from t1 to t2, the memory device 100 may apply a ground voltage to an unselected drain select line Unsel_DSL and an unselected source select line Unsel_SSL. Here, the channel potential Unsel_channel of the unselected memory cell strings may rise. In an embodiment, during the period from t1 to t2, the memory device 100 may apply the ground voltage to the unselected source select line Unsel_SSL and may apply a first turn-on voltage Von1 to the unselected drain select line Unsel_DSL for a preset time and thereafter apply the ground voltage thereto. The first turn-on voltage Von1 may be a voltage that is higher than the threshold voltages of the drain select transistor and the source select transistor.

During a period from t2 to t3, the memory device 100 may perform a first read operation Read1. The first read operation Read1 may be an operation that obtains data that is stored in memory cells by using the first read voltage Vrd1. The memory cells on which the first read operation Read1 is to be performed may be memory cells that are programmed to a program state that is higher than those of memory cells on which a second read operation Read2 is to be performed.

During the period from t2 to t3, the memory device 100 may apply the first read voltage Vrd1 to the selected word line Sel_WL. The first read voltage Vrd1, illustrated in FIG. 7, may be the seventh read voltage Vr7 or the fifth read voltage Vr5, illustrated in FIG. 6. During the period from t2 to t3, the memory device 100 may maintain the pass voltage Vpass that is applied to the unselected word lines Unsel_WL. During the period from t2 to t3, the memory device 100 may maintain the select line voltage Vds that is applied to the selected drain select line Sel_DSL and the selected source select line Sel_SSL. During the period from t2 to t3, the memory device 100 may maintain the ground voltage that is applied to the unselected drain select line Unsel_DSL and the unselected source select line Unsel_SSL. Here, the channel potential Unsel_channel of the unselected memory cell strings may be maintained in the same state as during the period from t1 to t2.

During a period from t3 to t4, the memory device 100 may perform a potential adjustment operation. In detail, during the period from t3 to t4, the memory device 100 may apply the ground voltage to the selected word line Sel_WL. In an embodiment, the memory device 100 may apply the ground voltage to the selected word line Sel_WL for a preset time and thereafter apply a second read voltage Vrd2 that is lower than the first read voltage Vrd1 to the selected word line Sel_WL. During the period from t3 to t4, the memory device 100 may maintain the pass voltage Vpass that is applied to the unselected word lines Unsel_WL. During the period from t3 to t4, the memory device 100 may maintain the select line voltage Vds that is applied to the selected drain select line Sel_DSL and the selected source select line Sel_SSL.

During a period from t3 to t3-1, the memory device 100 may apply the first turn-on voltage Von1 to the unselected drain select line Unsel_DSL and the unselected source select line Unsel_SSL. Here, the channel potential Unsel_channel of the unselected memory cell strings may be lower than the channel potential Unsel_channel during the period from t1 to t3. In an embodiment, during the period from t3 to t3-1, the memory device 100 may apply the ground voltage to the unselected drain select line Unsel_DSL and may apply the first turn-on voltage Von1 to the unselected source select line Unsel_SSL. In this case, the degree to which the channel potential Unsel_channel of the unselected memory cell strings is lowered may be less than in the case in which the first turn-on voltage Von1 is applied to the unselected drain select line Unsel_DSL and the unselected source select line Unsel_SSL.

During a period from t3-1 to t4, the memory device 100 may apply the ground voltage to the unselected drain select line Unsel_DSL and the unselected source select line Unsel_SSL. Here, the channel potential Unsel_channel of the unselected memory cell strings may be maintained in the same state as during the period from t3 to t3-1.

In an embodiment, in the potential adjustment operation, the memory device 100 may adjust the channel potential Unsel_channel of the unselected memory cell strings by applying the first turn-on voltage Von1 to the unselected drain select line Unsel_DSL and the unselected source select line Unsel_SSL for a preset time and thereafter applying the ground voltage thereto.

During a period from t4 to t5, the memory device 100 may perform a second read operation Read2. The second read operation Read2 may be an operation of obtaining data that is stored in the memory cells by using the second read voltage Vrd2. The memory cells on which the second read operation Read2 is to be performed may be memory cells programmed to a program state that is lower than those of the memory cells on which the first read operation Read1 is to be performed.

During the period from t4 to t5, the memory device 100 may apply the second read voltage Vrd2 to the selected word line Sel_WL. The second read voltage Vrd2, illustrated in FIG. 7, may be the third read voltage Vr3 or the first read voltage Vr1, illustrated in FIG. 6. During the period from t4 to t5, the memory device 100 may maintain the pass voltage Vpass that is applied to the unselected word lines Unsel_WL. During the period from t4 to t5, the memory device 100 may maintain the select line voltage Vds that is applied to the selected drain select line Sel_DSL and the selected source select line Sel_SSL. During the period from t4 to t5, the memory device 100 may maintain the ground voltage that is applied to the unselected drain select line Unsel_DSL and the unselected source select line Unsel_SSL. Here, the channel potential Unsel_channel of the unselected memory cell strings may be maintained in the same state as during the period from t3 to t4.

After time t5, the memory device 100 may discharge the voltages of the selected word line Sel_WL, the unselected word lines Unsel_WL, the selected drain select line Sel_DSL, and the selected source select line Sel_SSL to the ground voltage.

In accordance with an embodiment of the present disclosure, the channel potential Unsel_channel of the unselected memory cell strings may be raised by applying the ground voltage to the unselected drain select line Unsel_DSL and the unselected source select line Unsel_SSL during the potential adjustment operation before the first read operation Read1. However, as the read voltage having a low level is applied to the selected word line Sel_WL in the state in which the channel potential Unsel_channel of the unselected memory cell strings is raised, a phenomenon in which the threshold voltages of the selected memory cells that are coupled to the selected word line are varied may occur. Accordingly, during the potential adjustment operation before the second read operation Read2, the channel potential Unsel_channel of the unselected memory cell strings may be lowered by applying the first turn-on voltage Von1 to the unselected drain select line Unsel_DSL and the unselected source select line Unsel_SSL for the preset time and thereafter applying the ground voltage thereto, thus improving the phenomenon in which the threshold voltages of the selected memory cells are varied.

Figure 8:
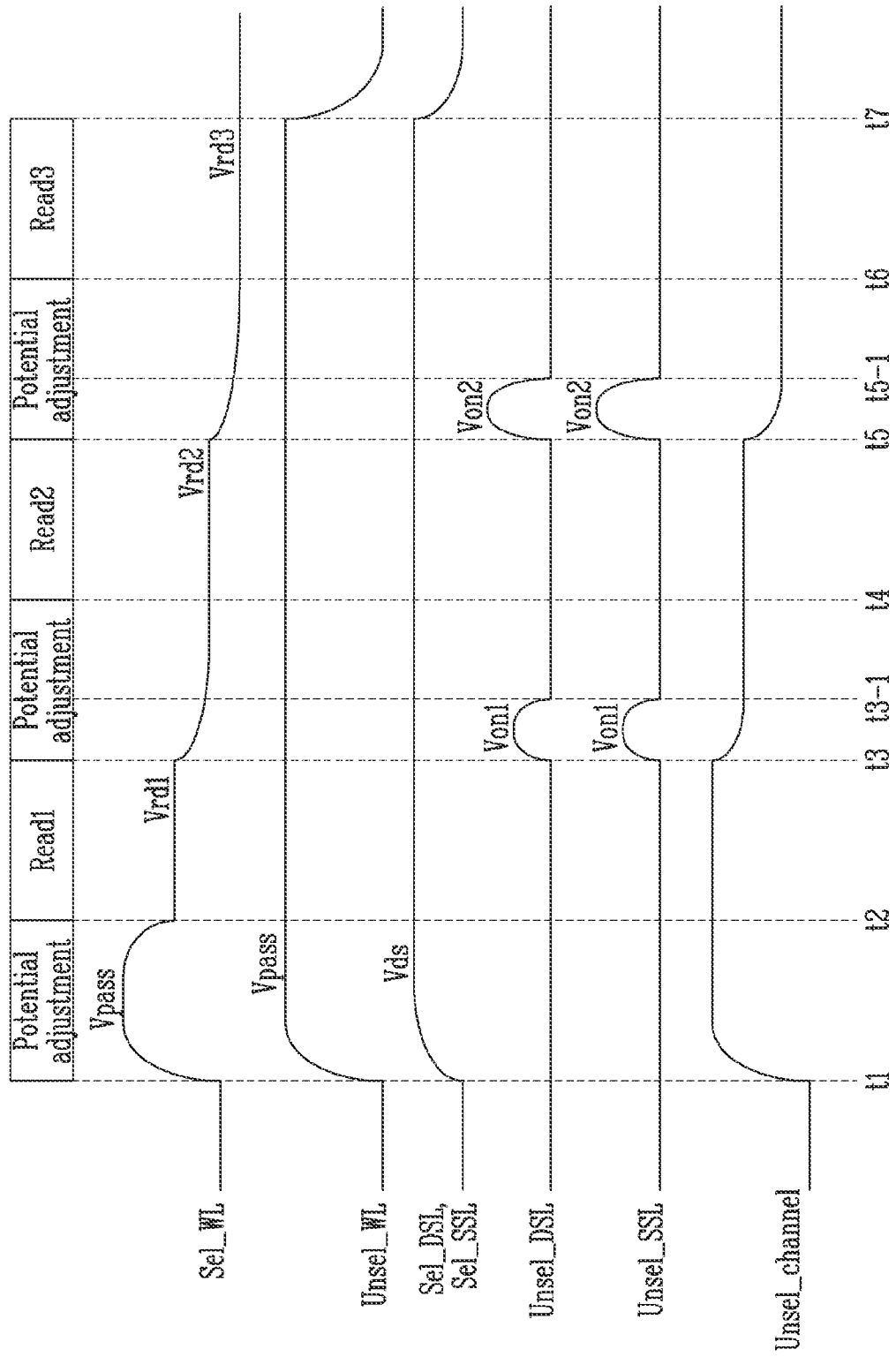
FIG. 8 is a diagram illustrating a first read operation, a second read operation, and a third read operation according to an embodiment of the present disclosure.

FIG. 8 is a diagram illustrating a first read operation, a second read operation, and a third read operation according to an embodiment of the present disclosure.

Because a period from t1 to t5 of FIG. 8 is identical to the period from t1 to t5 of FIG. 7, repeated descriptions of configuration identical to that of FIG. 7 thereof will be omitted.

Referring to FIG. 8, the memory device 100 may perform a first read operation Read1, a second read operation Read2, and a third read operation Read3. In an embodiment, the first read operation Read1, the second read operation Read2, and the third read operation Read3 may be read operations performed on a CSB page by using the second read voltage Vr2, the fourth read voltage Vr4, and the sixth read voltage Vr6, illustrated in FIG. 6. That is, the first read operation Read1, the second read operation Read2, and the third read operation Read3 may be read operations performed by using three read voltages.

In an embodiment, the memory device 100 may perform a potential adjustment operation before the first to third read operations Read1, Read2, and Read3.

During a period from t5 to t6, the memory device 100 may perform the potential adjustment operation. In detail, during the period from t5 to t6, the memory device 100 may apply the ground voltage to the selected word line Sel_WL. In an embodiment, the memory device 100 may apply the ground voltage to the selected word line Sel_WL for a preset time and thereafter apply a third read voltage Vrd3 that is lower than the second read voltage Vrd2 to the selected word line Sel_WL. During the period from t5 to t6, the memory device 100 may maintain the pass voltage Vpass that is applied to the unselected word lines Unsel_WL. During the period from t5 to t6, the memory device 100 may maintain the select line voltage Vds that is applied to the selected drain select line Sel_DSL and the selected source select line Sel_SSL.

During a period from t5 to t5-1, the memory device 100 may apply a second turn-on voltage Von2 to the unselected drain select line Unsel_DSL and the unselected source select line Unsel_SSL. In an embodiment, the second turn-on voltage Von2 may be a voltage that is higher than the first turn-on voltage Von1. In an embodiment, the magnitude of the second turn-on voltage Von2 may be equal to that of the first turn-on voltage Von1. Here, the channel potential Unsel_channel of the unselected memory cell strings may be lower than the channel potential Unsel_channel during the period from t3 to t5.

During a period from t5-1 to t6, the memory device 100 may apply the ground voltage to the unselected drain select line Unsel_DSL and the unselected source select line Unsel_SSL. Here, the channel potential Unsel_channel of the unselected memory cell strings may be maintained in the same state as during the period from t5 to t5-1.

During a period from t6 to t7, the memory device 100 may perform a third read operation Read3. The third read operation Read3 may be an operation of obtaining data that is stored in the memory cells by using the third read voltage Vrd3. The memory cells on which the third read operation Read3 is to be performed may be memory cells that are programmed to a program state that is lower than those of memory cells on which the second read operation Read2 is to be performed.

During the period from t6 to t7, the memory device 100 may apply the third read voltage Vrd3 to the selected word line Sel_WL. The third read voltage Vrd3 may be a negative voltage. The third read voltage Vrd3, illustrated in FIG. 8, may be the second read voltage Vr2, illustrated in FIG. 6. During the period from t6 to t7, the memory device 100 may maintain the pass voltage Vpass that is applied to the unselected word lines Unsel_WL. During the period from t6 to t7, the memory device 100 may maintain the select line voltage Vds that is applied to the selected drain select line Sel_DSL and the selected source select line Sel_SSL. During the period from t6 to t7, the memory device 100 may maintain the ground voltage that is applied to the unselected drain select line Unsel_DSL and the unselected source select line Unsel_SSL. Here, the channel potential Unsel_channel of the unselected memory cell strings may be maintained in the same state as that in the period from t5 to t6.

After time t7, the memory device 100 may discharge the voltages of the selected word line Sel_WL, the unselected word lines Unsel_WL, the selected drain select line Sel_DSL, and the selected source select line Sel_SSL to the ground voltage.

In accordance with an embodiment of the present disclosure, as the read voltage having a low level is applied to the selected word line Sel_WL in the state in which the channel potential Unsel_channel of the unselected memory cell strings is raised, the degree to which the threshold voltages of the selected memory cells that are coupled to the selected word line Sel_WL are varied may be high. Accordingly, during the potential adjustment operation before the third read operation Read3 using the third read voltage Vrd3 that is lower than the second read voltage Vrd2 that is used in the second read operation Read2, the phenomenon in which the threshold voltages of the selected memory cells are varied may be improved by applying the second turn-on voltage Von2, which is higher than the first turn-on voltage Von1, to the unselected drain select line Unsel_DSL and the unselected source select line Unsel_SSL for the preset time and thereafter applying the ground voltage to the unselected drain select line Unsel_DSL and the unselected source select line Unsel_SSL.

Figure 9:
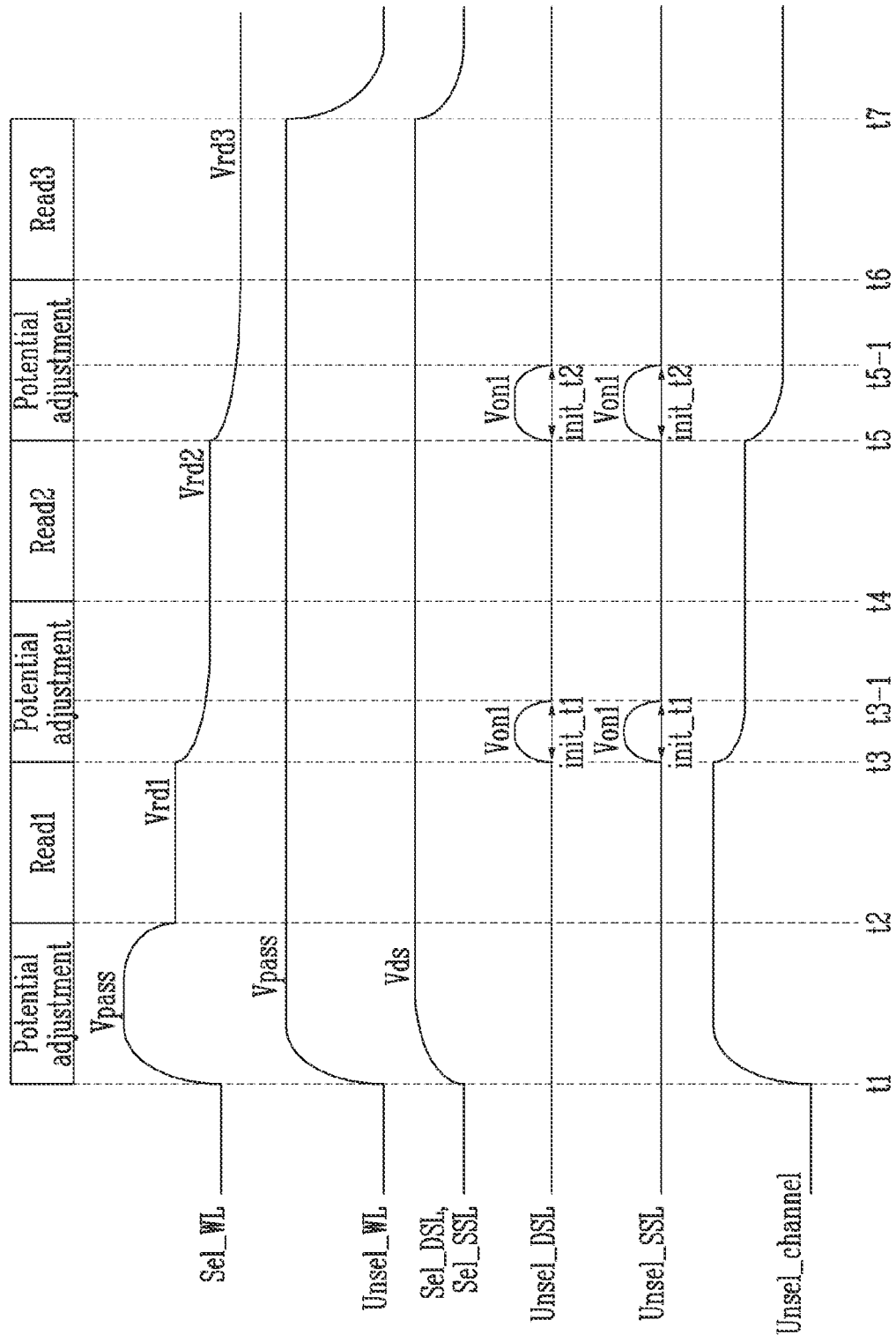
FIG. 9 is a diagram illustrating examples of a first read operation, a second read operation, and a third read operation according to an embodiment of the present disclosure.

FIG. 9 is a diagram illustrating examples of a first read operation, a second read operation, and a third read operation according to an embodiment of the present disclosure.

Repeated descriptions of configuration identical to that of FIG. 8 will be omitted in FIG. 9.

Referring to FIG. 9, during a period from t3 to t3-1, the memory device 100 may apply a first turn-on voltage Von1 to the unselected drain select line Unsel_DSL and the unselected source select line Unsel_SSL for a first time init_t1. During a period from t3-1 to t4, the memory device 100 may apply the ground voltage to the unselected drain select line Unsel_DSL and the unselected source select line Unsel_SSL.

During a period from t5 to t5-1, the memory device 100 may apply the first turn-on voltage Von1 to the unselected drain select line Unsel_DSL and the unselected source select line Unsel_SSL for a second time init_t2 that is longer than the first time init_t1. That is, the length of the period from t5 to t5-1 during which the first turn-on voltage Von1 is applied to the unselected drain select line Unsel_DSL and the unselected source select line Unsel_SSL may be longer than the length of the period from t3 to t3-1.

The degree to which the channel potential Unsel_channel of the unselected memory cell strings is lowered may be higher as the time during which the first turn-on voltage Von1 is applied to the unselected drain select line Unsel_DSL and the unselected source select line Unsel_SSL is longer in the potential adjustment operation. The third read voltage Vrd3 that is used in the third read operation Read3 may be lower than the second read voltage Vrd2 that is used in the second read operation Read2. Accordingly, the memory device 100 may set the time init_t2, during which the first turn-on voltage is applied to the unselected drain select line Unsel_DSL and the unselected source select line Unsel_SSL in the potential adjustment operation before the third read operation Read3, to be longer than the time init_t1, during which the first turn-on voltage is applied to the unselected drain select line Unsel_DSL and the unselected source select line Unsel_SSL in the potential adjustment operation before the second read operation Read2, thus improving a phenomenon in which the threshold voltages of memory cells are varied.

Figure 10:
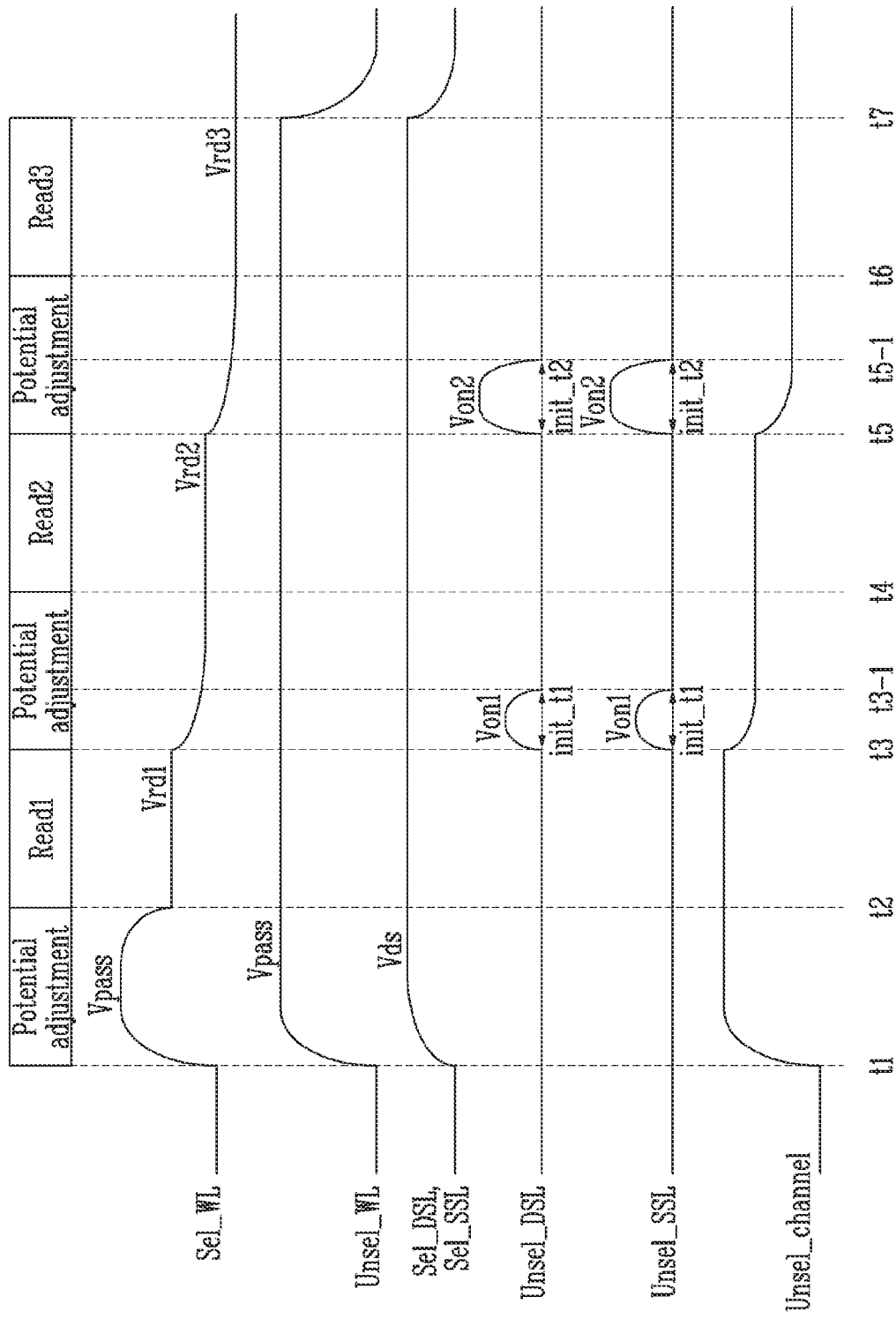
FIG. 10 is a diagram illustrating examples of a first read operation, a second read operation, and a third read operation according to an embodiment of the present disclosure.

FIG. 10 is a diagram illustrating examples of a first read operation, a second read operation, and a third read operation according to an embodiment of the present disclosure.

Repeated descriptions of configuration identical to that of FIGS. 8 and 9 will be omitted in FIG. 10.

Referring to FIG. 10, the memory device 100 may change at least one of the magnitude and application time of a turn-on voltage, applied to the unselected drain select line Unsel_DSL and the unselected source select line Unsel_SSL in a potential adjustment operation before a second read operation Read2 and a third read operation Read3. The magnitude of a second turn-on voltage Von2 that is applied to the unselected drain select line Unsel_DSL and the unselected source select line Unsel_SSL during the period from t5 to t5-1 may be higher than the magnitude of the first turn-on voltage Von1 that is applied to the unselected drain select line Unsel_DSL and the unselected source select line Unsel_SSL during the period from t3 to t3-1. Also, the time init_t2, during which the second turn-on voltage is applied to the unselected drain select line Unsel_DSL and the unselected source select line Unsel_SSL during the period from t5 to t5-1, may be longer than the time init_t1, during which the first turn-on voltage is applied to the unselected drain select line Unsel_DSL and the unselected source select line Unsel_SSL during the period from t3 to t3-1.

In an embodiment, the memory device 100 may change at least one of the magnitude and application time of the turn-on voltage that is applied to the unselected drain select line Unsel_DSL and the unselected source select line Unsel_SSL in the potential adjustment operation depending on the number of times that a program and erase operation is performed on the memory cells. In an example, the memory device 100 may increase the magnitude of the turn-on voltage that is applied to the unselected drain select line Unsel_DSL and the unselected source select line Unsel_SSL in the potential adjustment operation as the number of times that the program and erase operation is performed on the memory cells increases. In an example, the memory device 100 may increase the time during which the turn-on voltage is applied to the unselected drain select line Unsel_DSL and the unselected source select line Unsel_SSL in the potential adjustment operation as the number of times that the program and erase operation is performed on the memory cells increases.

In an embodiment, the memory device 100 may change at least one of the magnitude and application time of the turn-on voltage that is applied to the unselected drain select line Unsel_DSL and the unselected source select line Unsel_SSL in the potential adjustment operation depending on the number of times that a read operation is performed on the memory cells. In an example, the memory device 100 may increase the magnitude of the turn-on voltage that is applied to the unselected drain select line Unsel_DSL and the unselected source select line Unsel_SSL in the potential adjustment operation as the number of times that the read operation is performed on the memory cells increases. In an example, the memory device 100 may increase the time during which the turn-on voltage is applied to the unselected drain select line Unsel_DSL and the unselected source select line Unsel_SSL in the potential adjustment operation as the number of times that the read operation is performed on the memory cells increases.

In an embodiment, the memory device 100 may include a temperature sensor for measuring internal temperature of the memory device. Further, the memory device 100 may change at least one of the magnitude and application time of the turn-on voltage that is applied to the unselected drain select line Unsel_DSL and the unselected source select line Unsel_SSL in the potential adjustment operation depending on the measured temperature of the memory device. In an example, the memory device 100 may increase the magnitude of the turn-on voltage that is applied to the unselected drain select line Unsel_DSL and the unselected source select line Unsel_SSL in the potential adjustment operation as the temperature of the memory device is lower. In an example, the memory device 100 may increase the time during which the turn-on voltage is applied to the unselected drain select line Unsel_DSL and the unselected source select line Unsel_SSL in the potential adjustment operation as the temperature of the memory device is lower.

Figure 11:
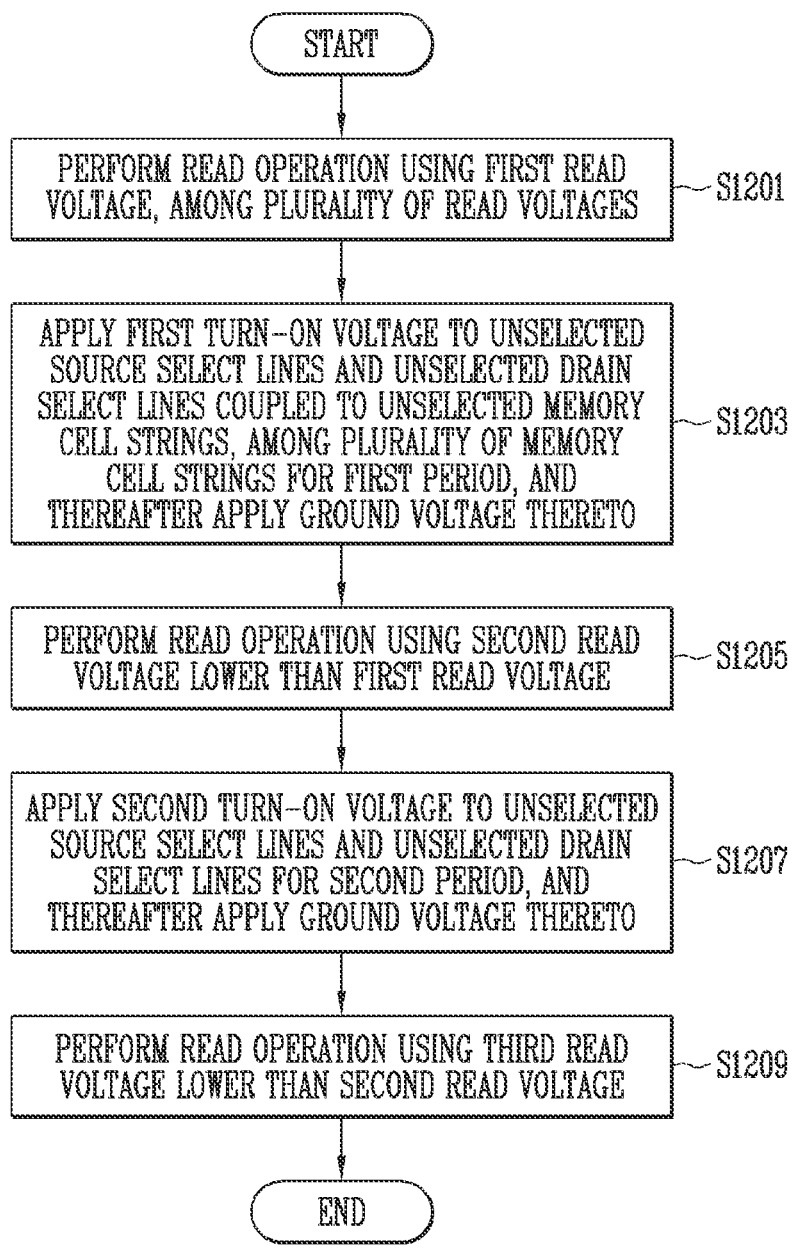
FIG. 11 is a flowchart illustrating a read operation of a memory device according to an embodiment of the present disclosure.

FIG. 11 is a flowchart illustrating a read operation of a memory device according to an embodiment of the present disclosure.

Referring to FIG. 11, at step S1201, the memory device 100 may perform a read operation by using a first read voltage, among a plurality of read voltages. The read operation may be an operation that reads any one of a plurality of logical pages. The first read voltage may be the highest voltage, among the plurality of read voltages that are used to perform the read operation. In an embodiment, the memory device 100 may apply a ground voltage to an unselected drain select line and an unselected source select line before performing the read operation by using the first read voltage.

At step S1203, the memory device 100 may apply a first turn-on voltage to unselected drain select lines and unselected source select lines that are coupled to unselected memory cell strings, among a plurality of memory cell strings, for a first period, and thereafter apply a ground voltage thereto. In an embodiment, the memory device 100 may apply the ground voltage to the unselected drain select lines while applying the first turn-on voltage to the unselected source select lines for the first period.

At step S1205, the memory device 100 may perform a read operation by using a second read voltage that is lower than the first read voltage.

At step S1207, the memory device 100 may apply the second turn-on voltage to the unselected source select lines and the unselected drain select lines for a second period, and thereafter apply the ground voltage thereto. In an embodiment, the length of the second period may be equal to or longer than that of the first period. In an embodiment, the magnitude of the second turn-on voltage may be equal to or higher than the first turn-on voltage.

At step S1209, the memory device 100 may perform a read operation by using a third read voltage that is lower than the second read voltage.

Figure 12:
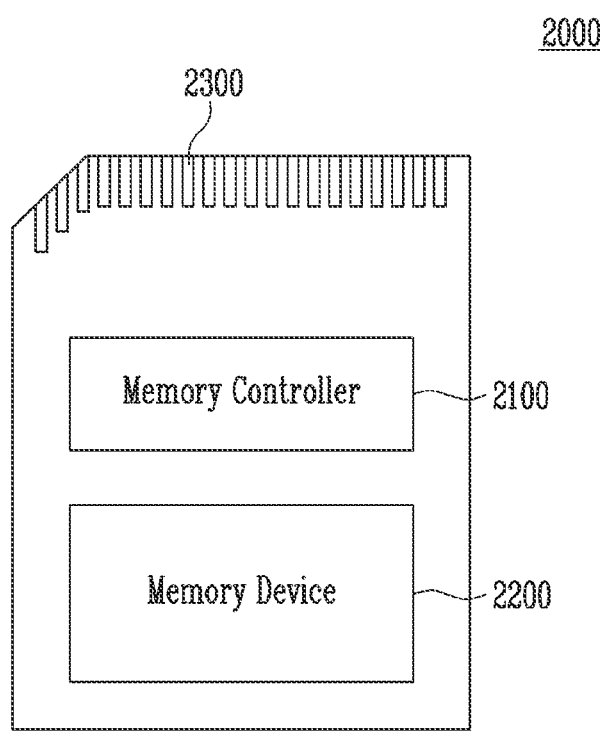
FIG. 12 is a block diagram illustrating a memory card system to which a memory system according to an embodiment of the present disclosure is applied.

FIG. 12 is a block diagram illustrating a memory card system to which a memory system according to an embodiment of the present disclosure is applied.

Referring to FIG. 12, a memory card system 2000 may include a memory controller 2100, a memory device 2200, and a connector 2300.

The memory controller 2100 may be coupled to the memory device 2200. The memory controller 2100 may access the memory device 2200. For example, the memory controller 2100 may control read, write, erase, and background operations of the memory device 2200. The memory controller 2100 may provide an interface between the memory device 2200 and a host. The memory controller 2100 may run firmware for controlling the memory device 2200. The memory controller 2100 may be implemented in the same manner as the memory controller 200, described above with reference to FIG. 1. The memory device 2200 may be implemented in the same manner as the memory device 100, described above with reference to FIG. 1.

In an embodiment, the memory controller 2100 may include components, such as a RAM, a processor, a host interface, a memory interface, and an error correction circuit.

The memory controller 2100 may communicate with an external device through the connector 2300. The memory controller 2100 may communicate with an external device (e.g., a host) based on a specific communication standard or protocol. In an embodiment, the memory controller 2100 may communicate with the external device through at least one of various communication standards or protocols, such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe). In an embodiment, the connector 2300 may be defined by at least one of the above-described various communication standards or protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), a Spin Transfer Torque magnetic RAM (STT-MRAM).

The memory controller 2100 and the memory device 2200 may be integrated into a single semiconductor device to configure a memory card. For example, the memory controller 2100 and the memory device 2200 may be integrated into a single semiconductor device to configure a memory card such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 13:
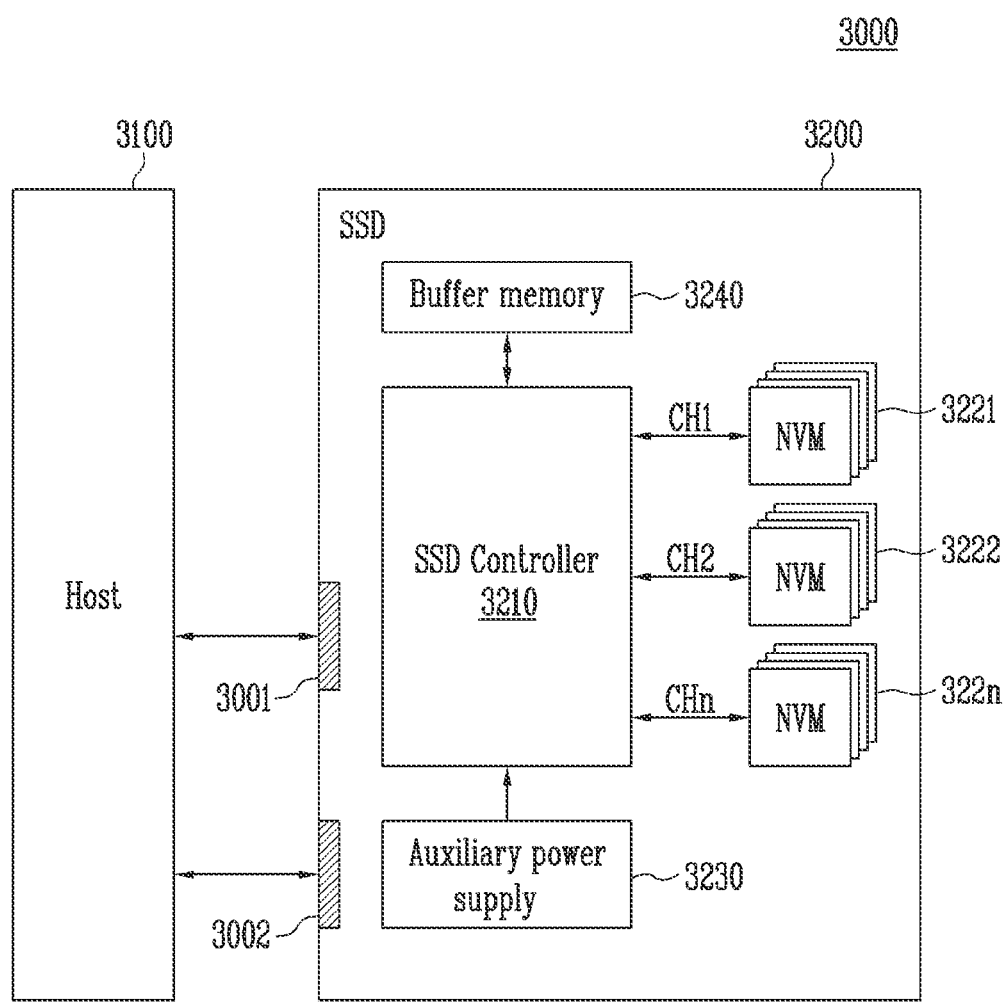
FIG. 13 is a block diagram illustrating a solid state drive (SSD) system to which a memory system according to an embodiment of the present disclosure is applied.

FIG. 13 is a block diagram illustrating a solid state drive (SSD) system to which a memory system according to an embodiment of the present disclosure is applied.

Referring to FIG. 13, an SSD system 3000 may include a host 3100 and an SSD 3200. The SSD 3200 may exchange signals with the host 3100 through a signal connector 3001 and may receive power through a power connector 3002. The SSD 3200 may include an SSD controller 3210, a plurality of flash memories 3221 to 322n, an auxiliary power supply 3230, and a buffer memory 3240.

In accordance with an embodiment of the present disclosure, the SSD controller 3210 may perform the function of the memory controller 200 described above with reference to FIG. 1.

The SSD controller 3210 may control the plurality of flash memories 3221 to 322n in response to the signals received from the host 3100. In an embodiment, the signals may be signals based on the interfaces of the host 3100 and the SSD 3200. For example, the signals may be signals defined by at least one of various interfaces, such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe).

The auxiliary power supply 3230 may be coupled to the host 3100 through the power connector 3002. The auxiliary power supply 3230 may be supplied with power from the host 3100 and may be charged. The auxiliary power supply 3230 may supply the power to the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 may function as a buffer memory of the SSD 3200. For example, the buffer memory 3240 may temporarily store data that is received from the host 3100 or data that is received from the plurality of flash memories 3221 to 322n or may temporarily store metadata (e.g., mapping tables) of the flash memories 3221 to 322n.

The buffer memory 3240 may include volatile memories, such as DRAM, SDRAM, DDR SDRAM, LPDDR SDRAM, and GRAM or nonvolatile memories, such as FRAM, ReRAM, STT-MRAM, and PRAM.

Figure 14:
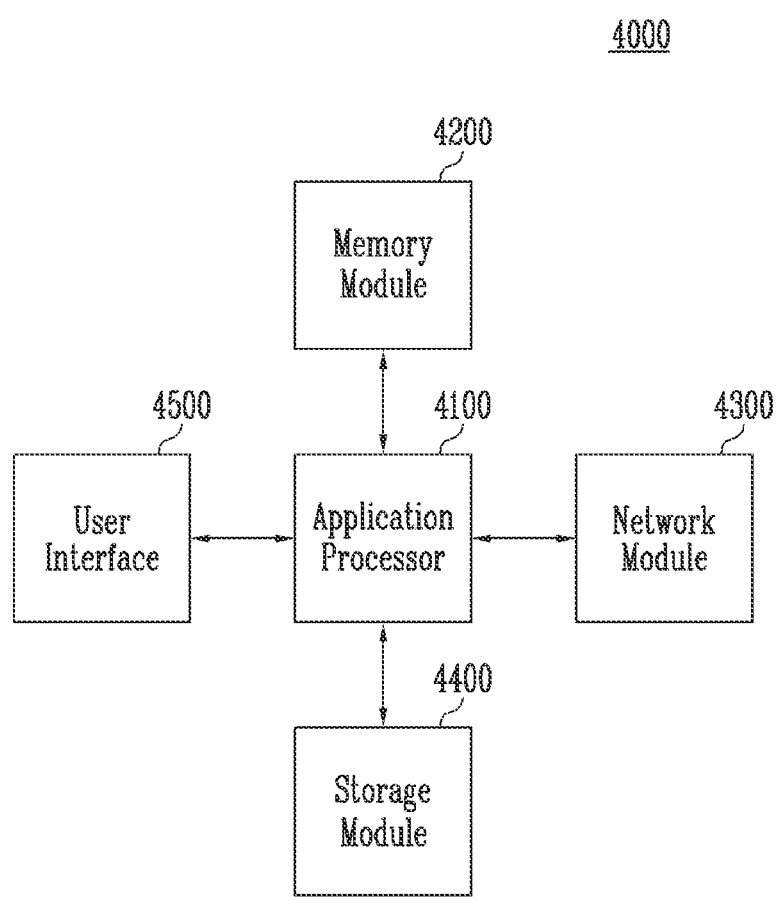
FIG. 14 is a block diagram illustrating a user system to which a memory system according to an embodiment of the present disclosure is applied.

FIG. 14 is a block diagram illustrating a user system to which a memory system according to an embodiment of the present disclosure is applied.

Referring to FIG. 14, a user system 4000 may include an application processor 4100, a memory module 4200, a network module 4300, a storage module 4400, and a user interface 4500.

The application processor 4100 may run components that are included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs, such as DRAM, SDRAM, DDR SDRAM, DDR2 SDRAM, DDR3 SDRAM, LPDDR SDRAM, LPDDR2 SDRAM, and LPDDR3 SDRAM, or nonvolatile RAMs, such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data that is received from the application processor 4100. Alternatively, the storage module 4400 may transmit the data that is stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same manner as the memory device 100, described above with reference to FIG. 1. The storage module 4400 may be operated in the same manner as the memory system 50, described above with reference to FIG. 1.

The user interface 4500 may include interfaces that input data or instructions to the application processor 4100 or output data to an external device. In an embodiment, the user interface 4500 may include user input interfaces, such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there are provided a memory device that is capable of improving a phenomenon in which the threshold voltages of memory cells are varied during a read operation, and a method of operating the memory device.

What is claimed is:

1. A memory device, comprising:
   a plurality of memory cell strings, each including a plurality of memory cells coupled between a drain select line and a source select line;
   a peripheral circuit configured to, using a plurality of read voltages, perform a read operation that reads data that is stored in a selected memory cell that is included in a selected memory cell string, among the plurality of memory cell strings; and
   an operation controller configured to control the peripheral circuit to perform:
      the read operation by using a first read voltage, among the plurality of read voltages;
      a first potential adjustment operation after performing the read operation; and
      the read operation, after performing the first potential adjustment operation, by using a second read voltage that is lower than the first read voltage,
      wherein the first potential adjustment operation is an operation that applies a first turn-on voltage to unselected source select lines that are coupled to unselected memory cell strings, among the plurality of memory cell strings, for a first period and thereafter applies a ground voltage to the unselected source select lines.

2. The memory device according to claim 1, wherein the operation controller is configured to control the peripheral circuit to apply the first turn-on voltage to unselected drain select lines that are coupled to the unselected memory cell strings for the first period and thereafter apply the ground voltage to the unselected drain select lines while the first potential adjustment operation is being performed.

3. The memory device according to claim 2, wherein the operation controller is configured to control the peripheral circuit to perform:
   after the read operation is performed by using the second read voltage, a second potential adjustment operation is performed, and the read operation is performed by using a third read voltage that is lower than the second read voltage,
   wherein the second potential adjustment operation is an operation that applies a second turn-on voltage that is higher than the first turn-on voltage to the unselected source select lines and the unselected drain select lines for the first period and thereafter applies the ground voltage to the unselected source select lines and the unselected drain select lines.

4. The memory device according to claim 2, wherein the operation controller is configured to control the peripheral circuit to perform:
   after the read operation is performed by using the second read voltage, a third potential adjustment operation is performed, and the read operation is performed by using a third read voltage that is lower than the second read voltage,
   wherein the third potential adjustment operation is an operation that applies the first turn-on voltage to the unselected source select lines and the unselected drain select lines for a second period that is longer than the first period and thereafter applies the ground voltage to the unselected source select lines and the unselected drain select lines.

5. The memory device according to claim 2, wherein the operation controller configured to control the peripheral circuit to perform:
   after the read operation is performed by using the second read voltage, a fourth potential adjustment operation is performed, and the read operation is performed by using a third read voltage that is lower than the second read voltage,
   wherein the fourth potential adjustment operation is an operation that applies a second turn-on voltage that is higher than the first turn-on voltage to the unselected source select lines and the unselected drain select lines for a second period that is longer than the first period and thereafter applies the ground voltage to the unselected source select lines and the unselected drain select lines.

6. The memory device according to claim 5, wherein the operation controller is configured to control the peripheral circuit to apply the ground voltage to the unselected source select lines and the unselected drain select lines before the read operation is performed by using the first read voltage.

7. The memory device according to claim 6, wherein:
   a length of each of the first period and the second period is longer as a number of times that a program and erase operation is performed on the selected memory cell is greater, and
   a magnitude of each of the first turn-on voltage and the second turn-on voltage is higher as the number of times that the program and erase operation is performed on the selected memory cell is greater.

8. The memory device according to claim 6, wherein:
   a length of each of the first period and the second period is longer as a number of times that the read operation is performed on the selected memory cell is greater, and
   a magnitude of each of the first turn-on voltage and the second turn-on voltage is higher as the number of times that the read operation is performed on the selected memory cell is greater.

9. The memory device according to claim 6, wherein:
   a length of each of the first period and the second period is shorter as a temperature of the memory device is higher, and
   a magnitude of each of the first turn-on voltage and the second turn-on voltage is lower as the temperature of the memory device is higher.

10. A method of operating a memory device, the memory device performing a read operation that reads data that is stored in a selected memory cell that is included in a selected memory cell string, among a plurality of memory cell strings, using a plurality of read voltages, the method comprising:
    performing the read operation by using a first read voltage, among the plurality of read voltages;
    applying a first turn-on voltage to unselected source select lines that are coupled to unselected memory cell strings, among the plurality of memory cell strings, for a first period and thereafter applying a ground voltage to the unselected source select lines; and
    performing the read operation by using a second read voltage that is lower than the first read voltage.

11. The method according to claim 10, further comprising:

applying the first turn-on voltage to unselected drain select lines that are coupled to the unselected memory cell strings for the first period and thereafter applying the ground voltage to the unselected drain select lines while applying the first turn-on voltage to the unselected source select lines for the first period and thereafter applying the ground voltage to the unselected source select lines.

12. The method according to claim 11, further comprising:

after the read operation is performed by using the second read voltage, applying a second turn-on voltage that is higher than the first turn-on voltage to the unselected source select lines and the unselected drain select lines for the first period and thereafter applying the ground voltage to the unselected source select lines and the unselected drain select lines; and performing the read operation by using a third read voltage that is lower than the second read voltage.

13. The method according to claim 11, further comprising:

after the read operation is performed by using the second read voltage, applying the first turn-on voltage to the unselected source select lines and the unselected drain select lines for a second period that is longer than the first period and thereafter applying the ground voltage to the unselected source select lines and the unselected drain select lines; and performing the read operation by using a third read voltage that is lower than the second read voltage.

14. The method according to claim 11, further comprising:

after the read operation is performed by using the second read voltage, applying a second turn-on voltage that is higher than the first turn-on voltage to the unselected source select lines and the unselected drain select lines for a second period that is longer than the first period; and performing the read operation by using a third read voltage that is lower than the second read voltage.

15. The method according to claim 14, further comprising:

before the read operation is performed by using the first read voltage, applying the ground voltage to the unselected source select lines and the unselected drain select lines.

16. The method according to claim 15, wherein:

a length of each of the first period and the second period is longer as a number of times that a program and erase operation is performed on the selected memory cell is greater, and a magnitude of each of the first turn-on voltage and the second turn-on voltage is higher as the number of times that the program and erase operation is performed on the selected memory cell is greater.

17. The method according to claim 15, wherein:

a length of each of the first period and the second period is longer as a number of times that the read operation is performed on the selected memory cell is greater, and a magnitude of each of the first turn-on voltage and the second turn-on voltage is higher as the number of times that the read operation is performed on the selected memory cell is greater.

18. The method according to claim 15, wherein:

a length of each of the first period and the second period is shorter as a temperature of the memory device is higher, and a magnitude of each of the first turn-on voltage and the second turn-on voltage is lower as the temperature of the memory device is higher.

* * * * *